United States Patent
Malsky (10) Patent No.: US 11,019,441 B2
(45) Date of Patent: May 25, 2021

(54) POSITION SENSOR FOR A VOICE COIL

(71) Applicant: Analog Devices, Inc., Norwood, MA (US)

(72) Inventor: Kenneth Edward Malsky, Bedford, MA (US)

(73) Assignee: Analog Devices, Inc., Wilmington, MA (US)

( * ) Notice: Subject to any disclaimer, the term of this patent is extended or adjusted under 35 U.S.C. 154(b) by 0 days.

(21) Appl. No.: 16/530,966

(22) Filed: Aug. 2, 2019

(65) Prior Publication Data

US 2021/0037329 A1  Feb. 4, 2021

(51) Int. Cl.
| | |
|---|---|
| *H04R 29/00* | (2006.01) |
| *H04R 9/06* | (2006.01) |
| *H04R 9/02* | (2006.01) |
| *G01R 29/08* | (2006.01) |
| *H04R 9/04* | (2006.01) |
| *H04R 1/06* | (2006.01) |

(52) U.S. Cl.
CPC ....... *H04R 29/003* (2013.01); *G01R 29/0807* (2013.01); *H04R 1/06* (2013.01); *H04R 9/025* (2013.01); *H04R 9/041* (2013.01); *H04R 9/045* (2013.01); *H04R 9/06* (2013.01)

(58) Field of Classification Search
CPC ........ H04R 29/003; H04R 1/06; H04R 9/025; H04R 9/041; H04R 9/045; H04R 9/06; H04R 29/001; H04R 29/002; H04R 3/007; G01B 29/0807
USPC ........................ 381/59, 58, 56, 150, 400–410
See application file for complete search history.

(56) References Cited

U.S. PATENT DOCUMENTS

| | | | |
|---|---|---|---|
| 4,243,839 A | 1/1981 | Takahashi et al. | |
| 5,197,104 A | 3/1993 | Padi | |
| 6,229,444 B1 * | 5/2001 | Endo .................. | G08B 13/2414 |
| | | | 340/572.6 |
| 6,243,472 B1 | 6/2001 | Bilan et al. | |
| 7,260,229 B2 | 8/2007 | Hlibowicki | |
| 7,460,682 B2 | 12/2008 | Suzuki | |

(Continued)

FOREIGN PATENT DOCUMENTS

| | | |
|---|---|---|
| CN | 106303883 A | 1/2017 |
| CN | 208401727 U | 1/2019 |

(Continued)

*Primary Examiner* — Vivian C Chin
*Assistant Examiner* — Con P Tran
(74) *Attorney, Agent, or Firm* — Wolf, Greenfield & Sacks, P.C.

(57) ABSTRACT

A position sensor may include a resonator attachable to a first object, and an antenna attachable to a second object and driven at a resonant frequency of the resonator. A change in a position of the first object relative to the second object may be sensed as a change in a power of the antenna when the antenna is driven at the resonant frequency of the resonator. The first object may be a former of a speaker, and a voice coil of the speaker may be positioned on the former together with the position sensor. In operation, the antenna may output a position signal to an external system of electronics, indicating a position of the voice coil. The external system of electronics may perform feedback processing to compensate for nonlinearities in the voice coil's position when the voice coil is used to drive a diaphragm of the speaker.

20 Claims, 8 Drawing Sheets

(56) References Cited

U.S. PATENT DOCUMENTS

| | | | |
|---|---|---|---|
| 8,675,908 B2 | 3/2014 | Pierce et al. | |
| 9,100,759 B2 | 8/2015 | Citerin | |
| 9,241,227 B2 | 1/2016 | Yamkovoy et al. | |
| 10,149,078 B2 | 12/2018 | Hogan et al. | |
| 2003/0072462 A1* | 4/2003 | Hlibowicki | H04R 3/007 381/96 |
| 2005/0062484 A1* | 3/2005 | Reining | G01V 3/101 324/655 |
| 2009/0060213 A1* | 3/2009 | Bachmann | H04R 3/002 381/59 |
| 2012/0294473 A1* | 11/2012 | Pierce | H04R 9/06 381/396 |
| 2014/0292597 A1* | 10/2014 | Schneider | H01Q 7/00 343/741 |
| 2015/0086026 A1* | 3/2015 | Tan | H04R 3/007 381/55 |
| 2019/0124430 A1 | 4/2019 | Wasinger et al. | |
| 2020/0053452 A1* | 2/2020 | Fallon | H04R 1/2803 |

FOREIGN PATENT DOCUMENTS

| | | |
|---|---|---|
| EP | 0 048 116 A1 | 3/1982 |
| EP | 0 809 414 A2 | 11/1997 |

* cited by examiner

POSITION SENSOR FOR A VOICE COIL

FIELD OF THE DISCLOSURE

The technology of the present application relates to position sensors that may be used with a voice coil, and to corresponding methods for determining a position of a voice coil.

BACKGROUND

A voice coil is a coil of wire commonly associated with sound transducers such as audio speakers. Typically, a permanent magnet is arranged near a voice coil, such that the voice coil is immersed in the magnetic field of the magnet. When current passes through the voice coil, a magnetic field is produced that reacts with the magnetic field of the permanent magnet, producing a force that causes the voice coil to move relative to the magnet. The voice coil may be attached to a diaphragm such that pistonic movement of the voice coil causes pistonic movement of the diaphragm, which causes audible sound waves to be produced. When the current through the voice coil corresponds to an audio signal, sound waves corresponding to the audio signal may be produced by the diaphragm. That is, the frequency and amplitude of audio signal determines the distance that the voice coil moves and the rate of back-and-forth movement and, consequently, determines the frequency and amplitude of the sound waves produced by the diaphragm.

Ideally, an amplitude of the current through the voice coil would correspond linearly to a position of the voice coil relative to the magnet. For example, in an ideal situation, each increase of x Amps through the voice coil would correspond to an increase of y millimeters from the magnet. However, physical limitations may cause non-ideal situations in which movement of the voice coil may deviate from a linear relationship with current that flows through the voice coil.

SUMMARY OF THE DISCLOSURE

Position sensors and methods of using the position sensors are provided. The sensors and methods utilize principles of electromagnetism, and may be applicable for remotely sensing a position of an object.

In an aspect of the present technology, a position sensor may comprise a resonator and an antenna. The resonator may be attachable to a first object. The antenna may be attachable to a second object. The first and second objects may be physically separate from each other. When the antenna is driven at a resonant frequency of the resonator, a change in a position of the first object relative to the second object may be sensed as a change in a power of the antenna.

According to one of various features of the aspect of the present technology, when a constant current passes through the antenna, the change in the position of the first object relative to the second object may be sensed by a change in a voltage of the antenna. Alternatively, according to another one of the various features of the aspect of the present technology, when the antenna is operated at a constant voltage, the change in the position of the first object relative to the second object may be sensed by a change in a current that passes through the antenna.

According to one of the various features of the aspect of the present technology, the antenna may comprise a flat coil disposed on a tacky surface. The antenna may be attachable to the second object by pressing the tacky surface against a surface of the second object.

According to one of the various features of the aspect of the present technology, the resonator may comprise a wire connected to a capacitor. The wire may be attachable to the first object as a winding wound around the first object, such that the winding may form an inductor.

In another aspect of the present technology, a voice-coil position sensor may comprise a pole piece, a magnet, a former, a voice coil, a resonator, and an antenna. The magnet may be arranged at a fixed position relative to the pole piece, such that a magnetic field of the magnet may extend from a first end of the magnet through the pole piece to a second end of the magnet. The former may be structured for movement relative to the pole piece, along an axial direction of the pole piece. The voice coil may be attached to the former such that movement of the voice coil causes movement of the former relative to the pole piece. The resonator may be attached to the former, and the antenna may be driven at a resonant frequency of the resonator.

According to one of various features of the aspect of the present technology, the resonator may be an LC resonator comprising a resonator coil and a capacitor. The voice coil may be wound around a first portion of the former, and the resonator coil may be wound around a second portion of the former separate from the first portion of the former. The pole piece and the antenna may be attached to a first plate. The second portion of the former may be relatively closer to the first plate than the first portion of the former.

According to one of the various features of the aspect of the present technology, the former may comprise a dielectric portion, and the capacitor may comprise first and second metal layers sandwiching the dielectric portion in between. A first end of the resonator coil may be electrically connected to the first metal layer, and a second end of the resonator coil may be electrically connected to the second metal layer. For example, the former may comprise a polyimide film, and the first and second metal layers may comprise first and second layers of copper foil. The dielectric portion may comprise a portion of the polyimide film.

According to one of the various features of the aspect of the present technology, the antenna may be a flat coil encircling the pole piece. A first power lead may be attached to a first end of the flat coil, and a second power lead may be attached to a second end of the flat coil. The first and second power leads may extend through the first plate.

According to one of the various features of the aspect of the present technology, the magnet may be a hollow cylindrical magnet arranged to encircle the pole piece.

In a further aspect of the present technology, a method for controlling a position of a voice coil is provided. The voice coil may be in an arrangement in which: the voice coil and a resonator may be attached to a former, a magnet may be arranged at a fixed position relative to the pole piece, the former may be movable relative to the pole piece along the axis of the pole piece, the voice coil may move relative to the pole piece along the axis of the pole piece in response to a power established in the voice coil, and an antenna tuned to a resonant frequency of the resonator may be arranged at a fixed position relative to the pole piece. In the method, a first power may be established in the voice coil; an actual position of the voice coil at the first power may be determined by measuring a power of the antenna when the first power is established in the voice coil; and, if the actual position of the voice coil at the first power is not within a predetermined distance from a desired position of the voice coil at the first power, feedback control may be used to adjust the first power in the voice coil to a compensated power for which the actual position of the voice coil may be within the predetermined distance from the desired position.

According to one of various features of the aspect of the present technology, the method may further comprise determining a range of linear powers; determining an adjusted power for each of a plurality of nonlinear powers outside of the range; and, when a voice-coil signal indicates that a linear power within the range is to be established in the voice coil, causing the linear power to be established in the voice coil, or, when the voice-coil signal indicates that a nonlinear power outside of the range is to be established in the voice coil, causing an adjusted power corresponding to the nonlinear power to be established in the voice coil. The determining of the range of linear powers may comprise, for a linear power within the range, determining that an actual position of the voice coil at the linear power is within the predetermined distance from a desired position of the voice coil at the linear power. The determining of the adjusted powers may comprise determining, for each of the plurality of nonlinear powers outside of the range, determining an adjusted power for which an actual position of the voice coil at the adjusted power is within the predetermined distance from a desired position of the voice coil at the nonlinear power.

As will be appreciated by those having ordinary skill in the art, establishing a power in the voice coil may be achieved by controlling a variable current through the voice coil at a constant voltage, or controlling a variable voltage at a constant current through the voice coil, or controlling a variable voltage and controlling a variable current through the voice coil.

BRIEF DESCRIPTION OF DRAWINGS

Various aspects of the technology and embodiments of the application will be described with reference to the following figures. It should be appreciated that the figures are not necessarily drawn to scale. Items appearing in multiple figures are indicated by the same reference numeral in all the figures in which they appear.

DETAILED DESCRIPTION

Sound transducers such as audio speakers typically use a voice coil as a motor to drive movement of a diaphragm to produce sound waves for audible sound. Pistonic or back-and-forth motion of the diaphragm at different amplitudes and different frequencies pushes air to produce sound that varies in volume and pitch according to the different amplitudes and the different frequencies.

Figure 1:
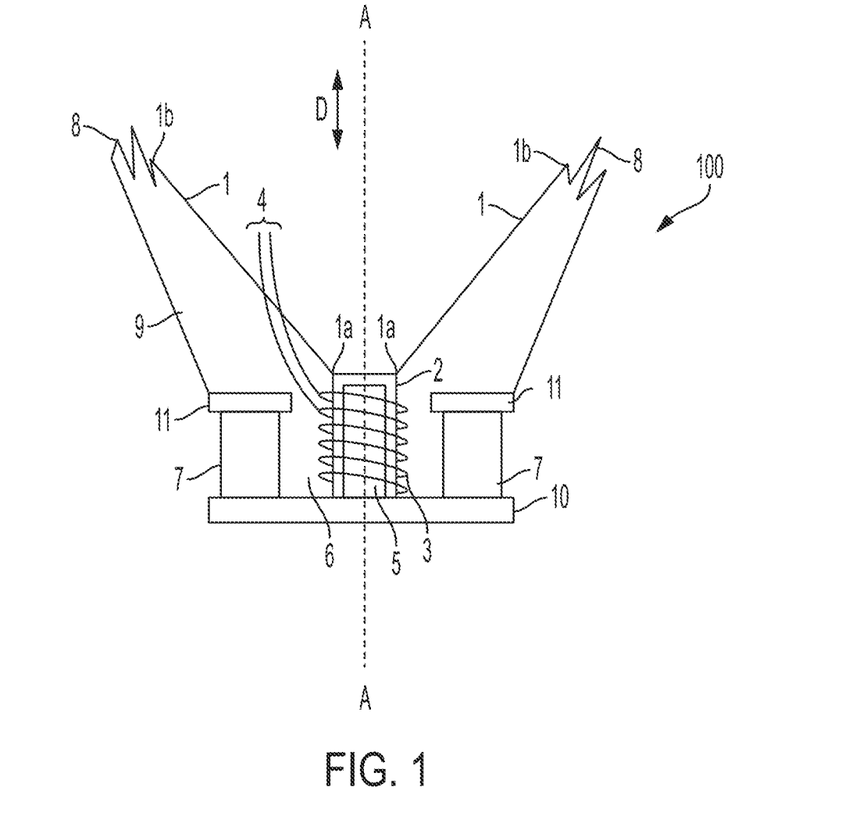
FIG. 1 schematically shows a cross-sectional view of a voice-coil speaker.

A cross-sectional view of an arrangement for a voice-coil transducer ("speaker") 100 for outputting sound is schematically shown in FIG. 1. A conical diaphragm ("cone") 1 may have a narrow, inner end 1a attached to a movable former 2. The cone 1 may be formed of paper, or cloth, or plastic, or metal, or another stiff and lightweight material known in the art. A voice coil 3 may be a winding of conductive wire or ribbon wound around the former 2. Ends of the voice coil 3 may be electrically connected, directly or via conductive leads, to cables 4 for providing an input signal to the voice coil 3. The voice coil 3 may be formed of copper, aluminum, or another electrically conductive material known in the art.

The former 2, also known in the art as a bobbin, may be positioned around a pole piece 5, in a space 6 between the pole piece 5 and a permanent magnet 7. The former 2 may be formed of a lightweight insulative material such as, e.g., a sheet of paper or a polymeric film, e.g., polyimide. The pole piece 5 may be formed of a material having a high magnetic permeability, e.g., iron, such that a magnetic field of the magnet 7 may extend into one end of the pole piece 5 and out an opposite end of the pole piece 5. In FIG. 1, the magnet 7 is shown to have a cylindrical shape. However, as will be appreciated, a voice-coil speaker need not have a cylindrically shaped magnet but may instead have a magnet of another shape, as discussed below.

The magnetic field of the magnet 7 may be considered a "DC" magnetic field because it may have a constant strength and a constant orientation. When power is supplied to the voice coil 3 (i.e., when current and voltage are applied), a force is created that may push the voice coil 3 to move in back-and-forth directions D, aligned with an axis A of the pole piece 5. When the voice coil 3 moves in response to the supplied power, the former 2 may also move and, in turn, may push the cone 1 to move back and forth.

The cone 1 may have a wide, outer end 1b attached to a suspension device 8 supported by a chassis 9. The suspension device 8, also known in the art as a surround, may have a spring-like structure that, together with the chassis 9, may maintain a centralized position of the cone 1 relative to the pole piece 5 and, at the same time, may enable the cone 1 to move freely in the back-and-forth directions D. For example, the suspension device 8 may have an accordion-like structure, a corrugated structure, or other resilient structure that may freely expand and contract. The chassis 9, also known in the art as a basket or a frame, may be a rigid structure that anchors a portion of the suspension device 8 at a fixed position relative to the pole piece 5. For example, the chassis 9 may be formed of wood, or metal, or plastic, or another rigid material able to support the suspension device 8. A second suspension device (not shown), known in the art as a spider, may be attached to the inner end 1a of the cone 1 and to the chassis 9, to deter non-pistonic rocking motion of the cone 1.

The pole piece 5 and the magnet 7 may be supported by a first plate 10. The pole piece 5 and the first plate 10 may be integrally formed as a single structure, e.g., by known metal-casting techniques, or may be separate structures that are joined together, e.g., by known metal-joining techniques. The pole piece 5 may be formed of a material having a high magnetic permeability, e.g., iron. The first plate 10, also known in the art as a base plate or a bottom plate, may be formed of a material having a high magnetic permeability, which may be the same as the material forming the pole piece 5 or a different material.

A second plate 11 may be disposed on the magnet 7, on a side opposite to the side adjacent the first plate 10. The second plate 11, also known in the art as a top plate, may be shaped as an annular disk, with the pole piece 5 and the former 2 extending through a central opening in the second plate 11. The second plate 11 may be formed of a material having a high magnetic permeability, which may be the same as the material forming the pole piece 5 and/or the first plate 10 or a different material.

The arrangement of the pole piece 5, the first plate 10, the second plate 11, and the magnet 7, as depicted in FIG. 1, may induce a north-south magnetic field that is directed from a second end of the magnet 7 (adjacent the second plate 11), then through the second plate 11 and across a magnetic gap to the pole piece 5, then through the pole piece 5 and the first plate 10, and then returning to a first end of the magnet 7 (adjacent the first plate 10). As discussed above, the voice coil 3 may include a winding formed of turns of wire, which may be disposed in the space 6. When current passes through the wire of the voice coil 3, a force is generated on the voice coil 3. This force is oriented parallel to the axis A of the pole piece 5.

As will be appreciated, as an area of the magnetic gap decreases, a magnetic flux density of the magnetic field increases. Thus, the central opening in the second plate 11 may be designed to have a particular size to obtain a desired magnetic flux density of the magnet 7. The area of the magnetic gap may be determined using, for example, a diameter of the central opening of the second plate 11 and an outer diameter of the voice coil 3.

A volume of the magnetic gap includes a portion occupied by turns of the wire forming the voice coil 3. As will be appreciated, as the portion of the volume of the magnetic gap occupied by the wire of the voice coil 3 increases, a drive force produced by the voice coil 3 increases. As a consequence, great care may be taken to wind the wire of the voice coil 3 efficiently on the former 2 to maximize a length of the wire of the voice coil 3 and to minimize both a space between the former 2 and the pole piece 5 and a space between outer turns of the wire of the voice coil 3 and the second plate 11.

Because the former 2 must move when the voice coil 3 moves in response to electrical power passing through the voice coil 3, it may be desirable for the former 2 as well as components supported by and/or attached to the former 2 to be light in weight.

Of the components that form the speaker 100, the voice coil 3 typically is manufactured with highest precision. That is, the winding of the voice coil 3 typically is made within tight dimensional and electrical tolerances, even on inexpensive transducers, especially compared to tolerances on other components of the speaker 100. Such tight manufacturing tolerances typically result in speakers that operate uniformly from speaker to speaker, with minimal operational differences.

Despite the high manufacturing precision of voice coils, their performance as speaker drivers may be limited by nonlinearities in their movement. As discussed above, when the voice coil 3 does not move predictably by a distance y for every x Amps of current, a listener may perceive a distortion in the sound produced by the speaker 100.

The performance of voice coils as speaker drivers may be detrimentally affected to varying degrees by a number of different physical constraints. These physical constraints may cause the voice coil 3 to move linearly in response to the current passing through the voice coil 3 only in a small range of operating currents. The following are three sources of nonlinearity:

(a) The voice coil 3 may have a full range of motion that extends beyond a constant-field region where the magnetic field of the magnet 7 is uniform. For example, if the current passing through the voice coil 3 causes the voice coil 3 to move into an outer region where the magnetic field is relatively weaker than the constant-field region, the position of the voice coil 3 may not track linearly with the current through the voice coil 3, thus causing a distorted sound to be produced when the current puts the voice coil 3 into the outer region. Stated differently, as the voice coil 3 moves beyond the second plate 11 an inductance of the voice coil 3 may drop, which may lead to nonlinearities in its movement;

(b) The suspension device 8, which supports the cone 1, may not maintain a consistent spring constant over the full range of motion of the voice coil 3. For example, if the suspension device 8 behaves inconsistently such that the pistonic movement of the cone 1 is restricted from reaching its intended position for certain values of the current, the cone 1 may not move back and forth for a full distance corresponding to the current through the voice coil 3 and, consequently, a listener may hear a distorted sound even if the current does not cause the voice coil 3 to go in the outer region; and (c) To a lesser extent than (a) or (b), a change in an environment of the voice coil 3 may cause variations in its inductance over the full range of motion of the voice coil 3. Environmental sources of nonlinearity may include temperature and humidity, among other possible sources. For example, ineffective cooling and/or localized heating may cause a segment of the voice coil 3 to have a different inductance than another segment of the voice coil 3. As a consequence, the voice coil 3 may move unpredictably in response to current through its winding, thus causing the position of the voice coil 3 to be unpredictable even when the current nominally is in a range of linear currents. Additionally, wear or aging of various components of the speaker 100, and/or a buildup of grime on various components of the speaker 100, could have an effect on the linearity of movement of the voice coil 3.

As will be appreciated, predictable linear movement over the full range of motion of the voice coil 3 is highly desirable. Designers of sound transducers have come up with various ways to minimize the causes of nonlinear effects and to maximize the linear motion of the cone 1. For example, designs that extend the constant-field region of the magnetic field of the magnet 7 and designs that improve the linearity and consistency of the suspension device 8 have been proposed; however, these designs may substantially increase the costs of materials as well as manufacturing costs of the speaker 100, and may increase the weight of the speaker 100 while reducing bandwidth and efficiency. The design of a sound transducer generally takes into consideration production factors, e.g., materials costs, manufacturing costs, weight, and complexity, and balances the production factors with sound-fidelity factors, e.g., low-frequency extension, sensitivity or decibels per watt, and minimization of distortion.

The inventors of the technologies disclosed herein have recognized and appreciated that an effective way to measure a voice coil's position with great accuracy would enable nonlinearities in the voice coil's movement to be compensated through the use of signal-processing techniques. More specifically, if the voice coil's desired position and actual position are known or are readily measurable then digital and/or analog signal-processing algorithms known in the art may be used to determine a modified drive signal to correct for the nonlinearities (i.e., to correct deviations of the actual position from the desired position). The inventors of the technologies disclosed herein have recognized and appreciated that a sensor that enables the voice coil's actual position to be determined accurately would enable the desired compensation to be performed, given that a mapping or relationship between a value measured by the sensor and the voice coil's desired or ideal (linear) position has been previously set or determined.

Under typical operating conditions, current flowing in the voice coil 3 of the speaker 100 may be entirely within a frequency range of human audio perception. Also, the voice coil 3 may have an inductance that is sufficient to resist pickup of stray magnetic fields. As mentioned above, the magnetic field and hence the magnetic flux of the magnet 7 may be "DC." Further, an rf field that could adversely affect movement of the voice coil 3 may not exist in the speaker 100. The only opening is a cavity formed by the space 6 comprising the magnetic gap, which is mostly filled with the wire of the voice coil 3. Under such conditions, a region bounded by the first and second plates 10, 11, the pole piece 5, and the magnet 7 may be shielded from external rf fields and also may be shielded from radiating any internally created rf field. Consequently, such a structure may allow the use of rf waves having a relatively low frequency within the cavity, without raising electromagnetic compatibility ("EMC") concerns or concerns about the impact rf fields on the voice coil 3.

Figure 2:
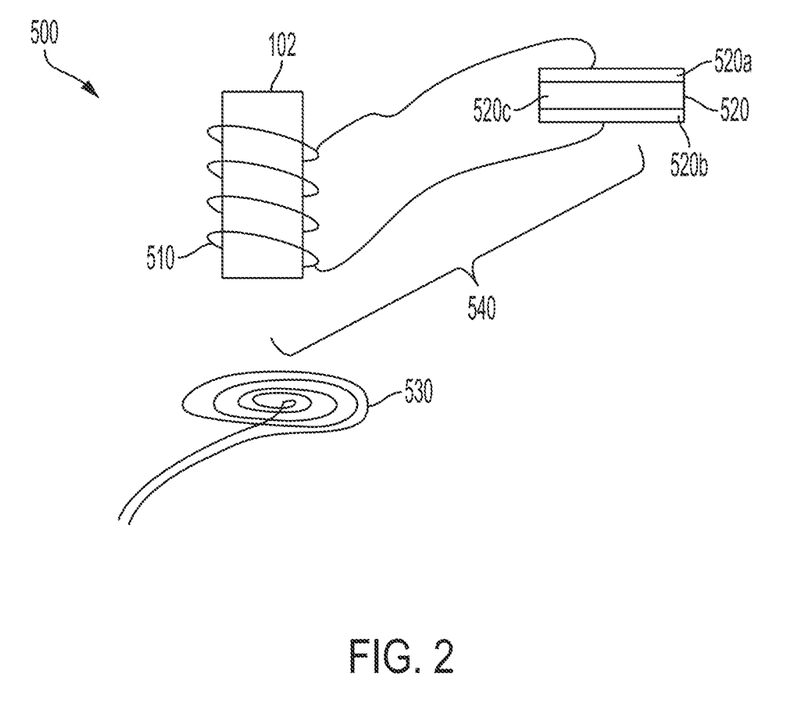
FIG. 2 schematically shows a position sensor according to an embodiment of the present technology.

FIG. 2 schematically shows a position sensor 500 according to an embodiment of the present technology. The position sensor 500 may comprise a sensor coil 510 wound around a movable object 102, and a capacitor 520 attached to the movable object 102 and connected in parallel with the sensor coil 510. The sensor coil 510 may be formed of a small number of turns of a low-resistance wire (e.g., copper wire or aluminum wire). The capacitor 520 may comprise first and second conductive layers 520a, 520b (e.g., copper layers) sandwiching a dielectric layer 520c, and may have a low ESR (equivalent series resistance). An antenna 530 may be arranged at a fixed position relative to the movable object 102 to detect an electrical characteristic of the sensor coil 510 when the position sensor 500 is in operation, as discussed in more detail below.

The sensor coil 510 in parallel with the capacitor 520 may form a tank circuit of a high-Q resonator 540. The sensor coil 510 may be an inductor having an inductance L, and may serve as a resonator coil of the resonator 540. The capacitor 520 may have a capacitance C, such that the resonator 540 may have a known LC resonance. An oscillating field passing through the sensor coil 510 of the resonator 540 and tuned to the LC resonance of the resonator 540 may induce a current to flow in the sensor coil 510. As will be appreciated, the lower the resistance in the resonator 540, the greater the induced current through the resonator 540 and the slower the induced current will decay.

The oscillating field may be produced by the antenna 530, which may be formed of a conductive coil. In operation, the antenna 530 may be supplied with an alternating current at the resonant frequency f of the resonator 540 attached to the movable object 102, with f given by:

$$f = \frac{1}{2\pi\sqrt{LC}}.$$

In an aspect of the embodiment, the resonant frequency f may be in a frequency range of from about 1 MHz to 20 MHz, and the signal provided to the antenna 530 may serve as a carrier signal. In this frequency range, a position signal sensed or detected by the antenna 530 may be AM modulated onto the carrier signal. Thus, the position signal may be obtained by conventional recovery techniques involving AM demodulation (e.g., mixing a signal with the carrier signal to move the carrier signal to a baseband, and then performing low-pass filtering). This type of demodulation may be used in either an analog signal domain or a digital signal domain.

As will be appreciated, there may be differences in the resonant frequency f amongst different speakers. Also, it will be appreciated that the resonant frequency f may change over time and/or due to changes in temperature. In order to minimize these effects, a "chirp" or "warble" excitation function may be used to excite a range of frequencies. Given that a frequency may be relatively stable over a time scale of a small number of minutes (e.g., less than 3 minutes), an adaptive tracking technique may be used periodically to locate a center frequency of the resonator 540 and detect the position at that resonant frequency f. This type of tracking may be desirable to ensure that the resonant frequency f is centered at the resonance, and to maintain the highest possible signal-to-noise ratio.

The antenna 530 may produce and transmit the oscillating field to the resonator 540 wirelessly. The resonator 540, in the presence of the oscillating field, may take energy from the antenna 530. Therefore, if the oscillating field is produced by powering the antenna 530 with a constant current, the energy taken by the resonator 540 may cause a drop in the voltage across the antenna 530. Similarly, if the oscillating field is produced by powering the antenna 530 with a constant voltage, the energy taken by the resonator 540 may cause a drop in the current through the antenna 530.

The drop in the voltage (or the current) in the antenna 530 may vary as a function of distance between the antenna 530 and the sensor coil 510. That is, the power in the antenna 530 may change as a function of distance between the antenna 530 and the sensor coil 510. This property may be exploited to sense a change in position of the sensor coil 510 from a rest position, which may be a position in the absence of movement of the movable object 102. When the movable object 102 is in motion, the change in power in the antenna 530 as a function of distance may be nonlinear. However, this change may be highly predictable due to the ability to manufacture the position sensor 500 reproducibly with a high degree of precision. Advances in manufacturing technology enable coils such as the sensor coil 510 and the conductive coil of the antenna 530 to be consistently produced to tight tolerances from manufacturing lot to manufacturing lot as well as within each manufacturing lot. As such, a relevant number of representative samples used to characterize the nonlinear behavior of the position sensor 500 may be small. Empirical characterization may involve averaging data obtained from the representative samples. For example, less than about ten representative samples from each of five different manufacturing lots for a total of 50 samples, may be used to obtain empirical data, and the empirical data may be processed (e.g., by averaging) to obtain characteristic data representing antenna power at various sensor-coil positions.

In an aspect of the embodiment, the empirical data may be charted on a graph, and the data may be fitted to a mathematical model. For example, an equation for antenna power as a function of sensor-coil position may be developed that fits the empirical data. The function may be, e.g., a polynomial fit, or an analog transfer function, or any other mathematical representation that may be used to map one quantity to another quantity.

In another aspect of the embodiment, the empirical data may be organized in a look-up table that maps antenna power to sensor-coil position (or vice versa), and stored in a memory.

Figure 3:
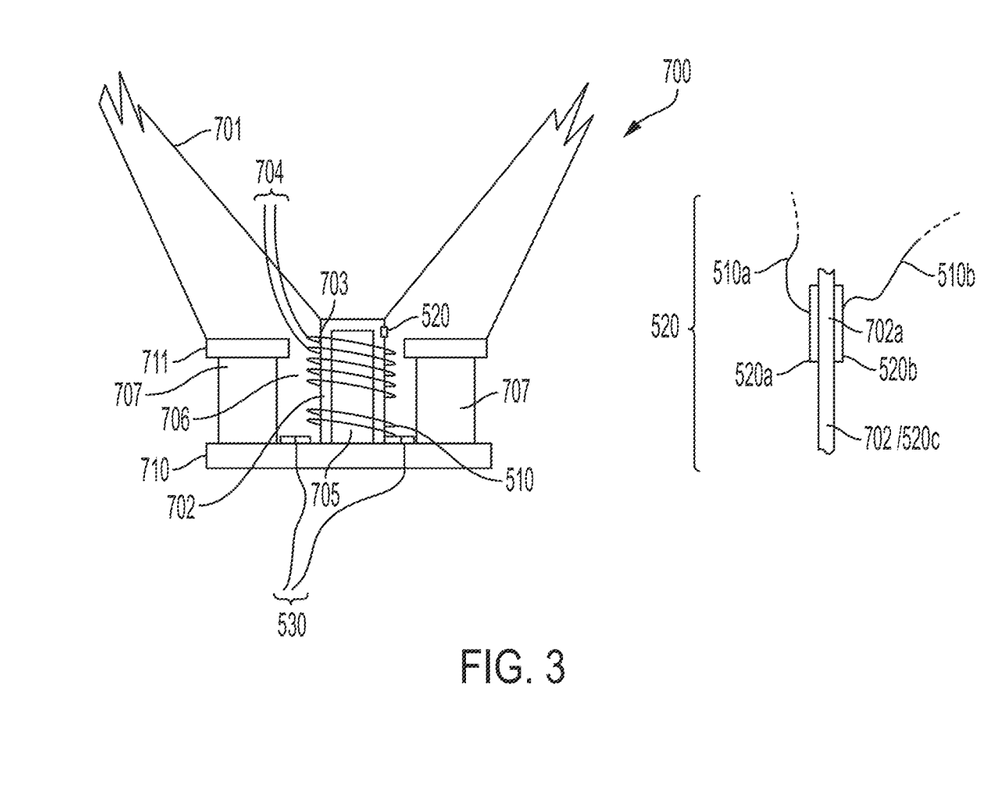
FIG. 3 schematically shows a cross-sectional view of a speaker employing the position sensor of FIG. 2 according to an embodiment of the present technology.

According to another embodiment of the present technology, the position sensor 500 may be used in an audio speaker 700 to track a position of a voice coil 703 of the speaker 700. A position of the resonator 540, which may be formed of the capacitor 520 connected in parallel with the sensor coil 510, may be used to determine a position of the voice coil 703. FIG. 3 schematically shows a cross section of the speaker 700. Various features of the speaker 100 shown in FIG. 1 and described above may be applicable to the speaker 700, which may be associated with reference numerals incremented by a value of 700 (e.g., the speaker 100 may have the voice coil 3 whereas the speaker 700 may have the voice coil 703). In such cases, the descriptions of these features with respect to the speaker 100 may be applicable to the speaker 700, but may not be repeated.

The speaker 700 may comprise a cone 701 attached to a movable former 702. The voice coil 703 may be wound around a first portion of the former 702, and the sensor coil 510 may be wound around a second portion of the former 702 such that the voice coil 703 and the sensor coil 510 do not directly contact each other. The ends of the voice coil 703 may be electrically connected to cables 704, which may be used to provide an input signal to the voice coil 703. Ends 510*a*, 510*b* of the sensor coil 510 may be connected in parallel to the capacitor 520, which may be attached to the former 702 but may not be in direct contact the voice coil 703.

In contrast to a conventional speaker design, in which the voice coil 3 winding would start near a base end of the former 2 so that the voice coil may be as close as possible to the first plate 10 to maximize a range of motion of the voice coil 3 within the magnetic gap, the speaker 700 of the present technology may enable the voice coil 703 to have fewer winding turns and to be positioned farther from the base end of the former 702 without sacrificing audio-output quality. As will be appreciated, the voice coil 703 would be considered outside of the magnetic gap 706 if no part of the voice coil 703 could be intersected by a plane of the second plate 711. The position sensor 500 advantageously may extend the range of motion of the voice coil 703 to a region outside of the magnetic gap 706 by enabling nonlinearities in the movement of the voice coil 703 to be detected and compensated. Thus, even though the wire of the voice coil 703 may be shortened slightly to provide room for the sensor coil 510 on the former 702, the shortened voice coil 703 nevertheless may provide superior audio-output quality by utilizing the resonator 540 (i.e., the sensor coil 510 and the capacitor 520) in conjunction with the antenna 530 to sense the position of the voice coil 703. Feedback or feedforward processing may be performed using the sensed position, so that nonlinearities may be compensated in real time for analog signals as well as digital signals. The position sensor 500 enables linearization of the movement of the voice coil 703 without increasing the strength of the magnet 707 and without increasing the length of the voice coil 703.

The feedback processing to correct a measured position of the voice coil 703 to a desired position may be implemented using a computer processor programmed to utilize the look-up table and/or the mathematical model, discussed above, to cause the current to the voice coil 703 to be modified to a value corresponding to the desired position.

The former 702 may be positioned around a pole piece 705, in a magnetic gap 706 between the pole piece 705 and a permanent magnet 707. For example, the magnet 707 may be cylindrical in shape and positioned on a first plate 710 formed of a material having a high magnetic permeability. The pole piece 705, also formed of a material having a high magnetic permeability, may extend through a hole of the cylindrical magnet 707, with the former 702 positioned in the magnetic gap 706 between the pole piece 705 and a second plate 711 formed of a material having a high magnetic permeability.

The former 702 may be formed of a polyimide material such as Kapton®. The capacitor 520 may be supported by the former 703 and may be a discrete component that may have leads connected in parallel to the ends of the sensor coil 510. Alternatively, because the former 702 must move when the voice coil 703 moves, as discussed above, the capacitor 520 may have a greater clearance for movement by incorporating a portion of the former 702 in its device structure.

In an aspect of the embodiment, the capacitor 520 may be a patch-type capacitor formed of a pair of copper layers 520*a*, 520*b* sandwiching a portion 702*a* of the former 702 in between. The copper layers 520*a*, 520*b* may have predetermined thicknesses and predetermined areas, and the Kapton® of the former 702 may have a known thickness and may serve as a dielectric portion of the capacitor 520. Therefore, the capacitor 520 may be formed with a desired capacitance for the position sensor 500.

For example, thin-film and/or thick-film deposition techniques known in the field of microelectronics fabrication may be used to deposit and lithographically pattern copper films to form the first and second copper layers 520*a*, 520*b* on opposite sides of the Kapton® of the former 702. For example, the Kapton® of the former 702 may have a known thickness in a range of 50 μm to 250 μm, and may be, e.g., 50 μm or 100 μm or 150 μm or 200 μm or 250 μm. First and second copper films may be deposited on opposite sides of the Kapton® of the former 702. The first and second copper films may have the same thickness or may have different thicknesses in a range of from about 1000 Å (0.1 μm) or thinner to about 5 μm or thicker. The first and second copper films may be lithographically patterned such that the first and second copper layers 520*a*, 520*b* resulting from the patterning have desired areal dimensions. For example, the first and second copper layers 520*a*, 520*b* may be patterned to be rectangular and to have a same length of 10 mm and a same width of 5 mm. Optionally, the areal dimensions of the first copper layer 520*a* may be different from the areal dimensions of the second copper layer 520*b*. Known alignment techniques may be used in the patterning to position the first copper layer 520*a* to align with the second copper layer 520*b* on opposite surfaces of the Kapton® of the former 702.

Alternatively, instead of patterning copper films using lithographic techniques, pre-shaped pieces of copper foil may be adhered to opposite sides of the Kapton® of the former 702, to form the first and second copper layers 520*a*, 520*b*. The capacitor 520 may be formed of the pieces of copper foil in conjunction with the sandwiched portion of the Kapton® of the former 702 serving as the dielectric material 520*c*.

As will be appreciated, the specific areal dimensions and thicknesses of the first and second copper layers 520*a*, 520*b* may be tailored so that the capacitor 520 may have a desired capacitance for the position sensor 500.

Figure 4:
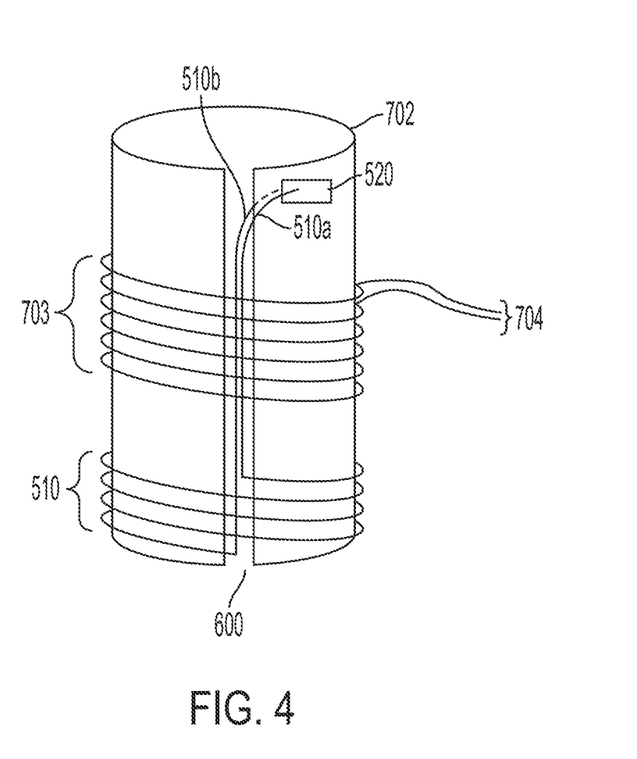
FIG. 4 schematically shows a portion of the speaker of FIG. 3 in more detail.

In an aspect of the embodiment, the sensor coil 510 may be connected to the capacitor 520 in a channel 600 separating opposite ends of the former 702, as schematically depicted in FIG. 4. The former 702 may be prepared from a flat sheet of material, e.g., Kapton®, that is wrapped around a shaper. For example, the shaper may be a cylinder having an outer diameter corresponding to a desired inner diameter of the former 702. The sheet of material may have a width that is slightly less than a circumference of the shaper, so that when the voice coil 703 is wound around the sheet of material on the shaper and, e.g., glued in place, the channel 600 remains under the voice coil 703. The channel 600 may be parallel to the axis A of the pole piece 705 and a length of the channel 600 corresponds to a height of the former 702. The channel 600 may be used as a space for the ends 510a, 510b of the sensor coil 510 to reach and connect with the capacitor 520.

For example, if the voice coil 703 is wound on the former 702 as a single layer of wire, the channel 600 may be used as a return path to bring one end of the wire near the base end of the former 702 (closer to the first plate 710) to meet the other end of the wire (closer to the second plate 711). In another example, if the voice coil 703 has two layers of wire, a return path is not needed because the second layer would bring the ends of the wire together so that both ends of the wire would extend generally in the same direction (i.e., toward the first plate 710 or toward the second plate 711). For either case, the channel 600 may be used as space for the ends of the sensor coil 510 (or for leads extending from the ends of the sensor coil 510) to reach the capacitor 520. The sensor coil 510 may be positioned on the former 702 near the base end of the former 702, and the capacitor 520 may be positioned on the former 702 near an opposite end toward the second plate 711; therefore, the channel 600 may be used as a conduit for the ends of the sensor coil 510 to reach the capacitor 520 near the second plate 711. If the capacitor 520 is a discrete component, leads of the discrete component may connect with the ends of the sensor coil 510; in such a case, a standard ceramic capacitor (e.g., a 5% MLCC) may be used for the capacitor 520. Alternatively, if the capacitor 520 is the patch-type of capacitor described above, one of the ends of the sensor coil 510 may be attached to the first copper layer 520a, and the other of the ends of the sensor coil 510 may be attached to the second copper layer 520b.

As will be appreciated, given that the geometry of the former 702 may be well controlled, and given that highly reproducible film deposition and patterning techniques have been established for fabrication of microelectronics, the patch-type capacitor described above may be more advantageous for use in the position sensor 500 than a discrete-component capacitor. The patch-type capacitor may provide a capacitor that has a lighter weight and a more uniform distribution of weight on the former 702 than a discrete-component capacitor, and may provide an advantage in movement clearance because its thin profile would be less likely to come into contact with the second plate 711.

In an aspect of the embodiment, the former 702 may be secured to the inner end 701a of the cone 701 by a durable adhesive, e.g., an epoxy, which may create a secure neck joint at the inner end 701a where the former 702 attaches to the cone 701.

A position of the voice coil 702 may be determined by sensing a position of the sensor coil 510 via the antenna 530. The antenna 530 may be arranged relative to the sensor coil 510 to sense the position of the sensor coil 510 wirelessly by sensing power changes in the antenna 530, as discussed above.

In an aspect of the embodiment, the antenna 530 may be formed of a conductive coil positioned on the first plate 710, such that the antenna 530 may remain at a fixed position on the first plate 710 while the sensor coil 510 moves together with the voice coil 703 and the former 702. The antenna 530 also may be wound around the pole piece 705 and physically attached to the first plate 710 such that ends of the conductive coil forming the antenna 530 may extend through holes in the first plate 710, enabling the antenna 530 to be connected to an external system of electronics ("external electronics") 900, schematically shown in the block diagram of FIG. 6.

Figure 6:
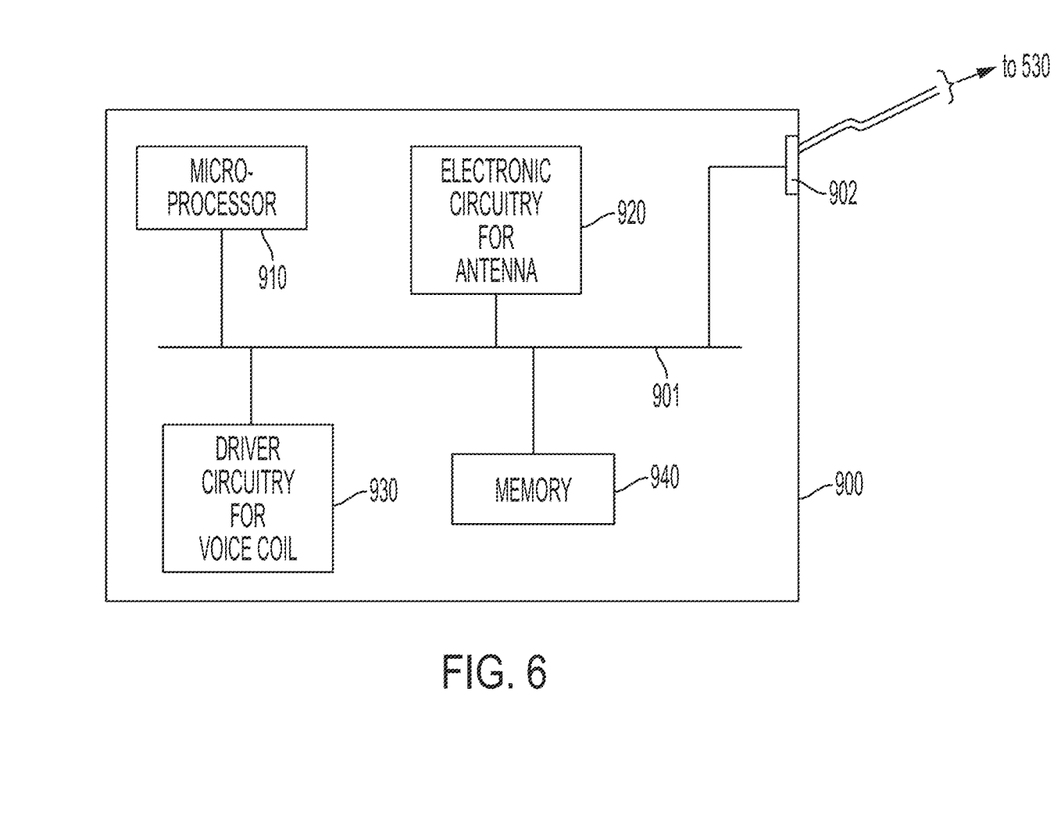
FIG. 6 shows a block diagram of an external system of electronics that may be connected to the antenna of FIG. 6 according to an embodiment of the present technology.

The external electronics 900 may comprise a microprocessor 910 and electronic circuitry 920 for providing power to the antenna 530 and for measuring changes in the power to the antenna 530. For example, the electronic circuitry 920 may provide to the antenna 530 an initial power at a fixed current and an initial voltage, and may measure changes in the voltage across the antenna 530 during operation of the speaker 700. The external electronics 900 also may comprise driver circuitry 930 for providing an audio signal to drive the voice coil 703.

The microprocessor 910 may perform compensation or feedback processing on the audio signal provided to the voice coil 703. The microprocessor 910 may receive voltage data from the electronic circuitry 920 and may determine an actual position of the voice coil 703 from the voltage data. The microprocessor 910 also may compare the actual position of the voice coil 703 with a desired position for the voice coil 703 based on the audio signal provided by the driver circuitry 930. If the actual position is not within a predetermined value from the desired position, then the microprocessor 910 may use a look-up table stored in a memory 940 of the external electronics 900, or may use code for a mathematical formula stored in the memory 940, to determine an adjustment to be made to the audio signal provided by the driver circuitry 930 to the voice coil 703. The predetermined value may be, for example, a fixed distance (e.g., ±0.2 cm) from the desired position. Alternatively, the predetermined value may be a fixed current (e.g., ±10 milliAmps) from a desired current for obtaining the desired position. As will be appreciated, the feedback processing by the microprocessor 910 may necessitate data storage (not shown) for signal buffering, which may be provided in the external electronics 900. Such buffering may entail a signal delay; however, the delay, if any, may be sufficiently short that it may not be readily perceived by a listener. Components of the external electronics 900 may be connected to a communication bus 901. An interface 902 may be provided for receiving signals (e.g., signals from the antenna 530) and for outputting signals (e.g., signals to the voice coil 703).

Figure 5A:
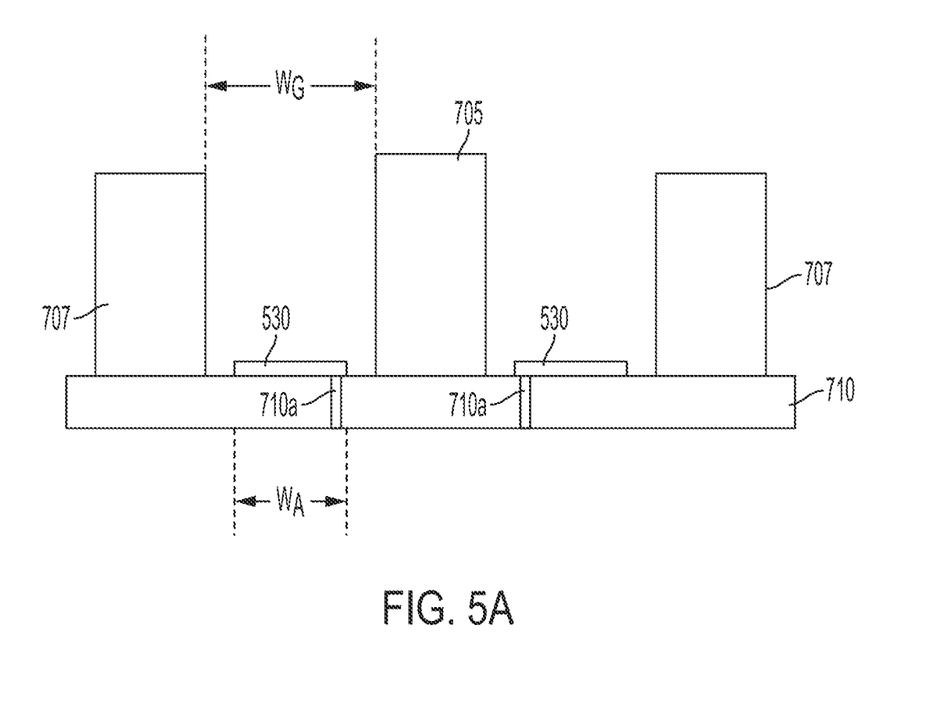
FIG. 5A schematically shows an environment of an antenna according to an embodiment of the present technology.

The conductive coil forming the antenna 530 may be a flat coil that may have a progressively increasing diameter from a central portion of the coil, why may be positioned closest to the pole piece 705, to an outer portion of the coil, which may be positioned farthest from the pole piece 705, as schematically illustrated in FIG. 5A. A plane of the flat coil of the antenna 530 may be parallel to the first plate 710. A radial width $W_A$ of the antenna 530, from the central portion closest to the pole piece 705 to the outer portion farthest from the pole piece, may less than a radial distance $W_G$ on the first plate 710 between the pole piece 705 and the magnet 707. With $W_A$ being less than $W_G$, the antenna 530 may lie flat on the first plate 710. The antenna 530 may be attached to the first plate 710 by glue or nonconductive clips or by tape. An advantageous aspect of having the antenna 530 be a flat coil on the first plate 710 is that such an arrangement minimizes interference with or restriction of a "throw" or end to end excursion of the voice coil 703.

Figure 5B:
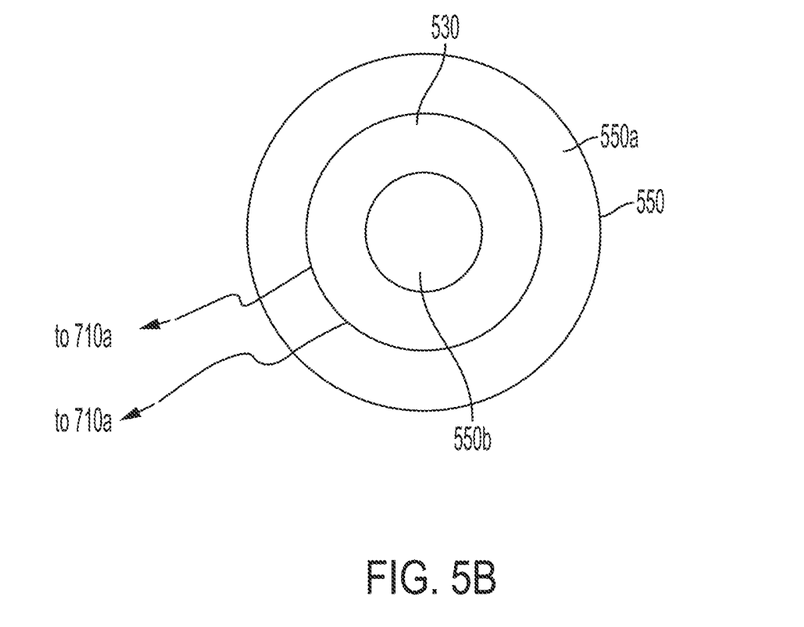
FIG. 5B schematically shows a plan view of an antenna according to an embodiment of the present technology.

For example, as schematically depicted in the plan view of FIG. 5B, the antenna 530 may be pre-shaped into the flat coil and disposed on a tacky surface 550a of a tacky sheet 550 (the winding of the flat coil is represented in detail in FIG. 5B). A surface of the tacky sheet opposite to the tacky surface 550a by be non-tacky. The ends of the antenna 530 may extend off the tacky sheet 550. The tacky sheet 550 may have a hole 550b at a central region of the flat coil, sized to accommodate the pole piece 705. When the speaker 700 is assembled, the tacky sheet 550 with the antenna 530 may be pressed against the first plate 710, and ends of the antenna 530 may be threaded through holes 710a in the first plate 710 (see FIG. 5A). For example, the tacky sheet 550 may be pressed again a blank comprising the first plate 710 and the pole piece 705. The magnet 707 may be arranged on the first plate 710 before or after the tacky sheet 550 with the antenna 530 is adhered to the first plate 710. If the magnet 707 is already arranged on the first plate 710, an outer perimeter 550c of the tacky sheet 550 may be structured to fit inside the magnet 707 such that a plane of the flat coil of the antenna 530 lies flat on and parallel to the first plate 710.

An advantageous aspect of using the tacky sheet 550 to carry the antenna 530 and adhere the antenna 530 to the first plate 710 is that it facilitates mass production of pre-assembled kits of the antenna 530 pre-adhered on the tacky sheet 550. Additionally, such pre-assembled kits may facilitate manufacturing of speakers such as the speaker 700, by streamlining the process of attaching the antenna 530 to the first plate 710.

Another advantageous aspect of having the sensor coil 510 and the voice coil 703 wound on the same former 702 and positioned around the high-magnetic-permeability pole piece 705 is that the position of the sensor coil 510 is directly linked to the position of the voice coil 703, and the coupling between the sensor coil 510 and the antenna 530 may be strong and consistent.

The discussions above focus on using the position sensor 500 to sense the position of the voice coil 703 of the speaker 700. However, the position sensor 500 is not limited to use in speakers and may also be for positioning in other types of structures. For example, the position sensor 500 may be used for positioning in other voice-coil-driven systems, such as camera lenses, industrial acoustic equipment, and noise-abatement systems, for example.

The arrangements described above are for a hollow cylindrical magnet surrounding a central pole piece.

Figure 7:
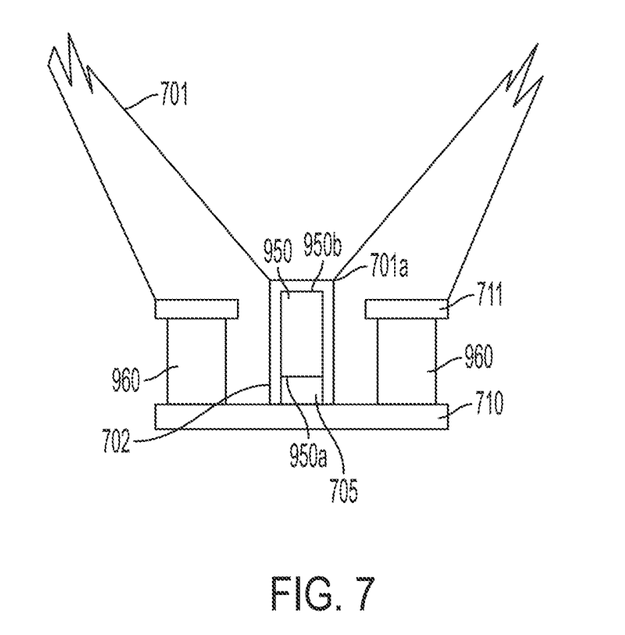
FIG. 7 schematically shows a cross-sectional view of a voice-coil speaker according to an embodiment of the present technology.

Alternatively, according to another embodiment of the present technology, the position sensor 500 may be used in an inverted arrangement in which a cylindrical bar magnet 950 is positioned centrally, and a hollow metal cylinder 960 may surround the cylindrical bar magnet and may be supported by the first plate 710, as schematically shown in the cross-sectional view of FIG. 7. The metal cylinder 960 and first plate 710 may be formed of the same material or different materials having a high magnetic permeability. With such an arrangement, the magnetic field of the magnet 950 may extend from a first end 950a of the magnet 950, through the first plate 710, the metal cylinder 960, and the second plate 711, across the magnetic gap 706, to a second end 950b of the magnet 950. For the sake of clarity, the voice coil 703 and the position sensor 500 are not shown in FIG. 7; however, their representation is analogous to what is shown in FIG. 3.

According to another embodiment of the present technology, a method for controlling a position of the voice coil 703 of the speaker 700 may comprise: establishing a first power in the voice coil 703; determining an actual position of the voice coil 703 at the first power by measuring a power of the antenna 530 when the first power is established in the voice coil; and, if the actual position of the voice coil 703 at the first power is not within a predetermined distance from a desired position of the voice coil 703 at the first power, performing feedback control to adjust the first power in the voice coil 703 to a compensated power for which the actual position of the voice coil 703 may be within the predetermined distance from the desired position. The feedback control may be performed using the external electronics 900 described above.

According to an aspect of the embodiment, the method may further comprise: determining a range of linear powers; determining an adjusted power for each of a plurality of nonlinear powers outside of the range; and, when an audio signal to be supplied to the voice coil 703 indicates that a linear power within the range is to be established in the voice coil 703, causing the linear power to be established in the voice coil 703, or, when the audio signal indicates that a nonlinear power outside of the range is to be established in the voice coil 703, causing an adjusted power corresponding to the nonlinear power to be established in the voice coil 703. The determining of the range of linear powers may comprise, for a linear power within the range, determining that an actual position of the voice coil 703 at the linear power is within the predetermined distance from a desired position of the voice coil 703 at the linear power. The determining of the adjusted powers may comprise determining, for each of the plurality of nonlinear powers outside of the range, determining an adjusted power for which an actual position of the voice coil 703 at the adjusted power is within the predetermined distance from a desired position of the voice coil 703 at the nonlinear power. The range of linear power and the nonlinear powers outside of the range may be stored in the memory 940.

Some aspects of the present technology may provide any one or any combination of the following advantageous features:

1. The position sensor 500 may directly return a position value for the voice coil 703, which enables velocity and/or acceleration of the voice coil 703 to be calculated. No complicated adaptive physical modeling would be needed to determine the position of the voice coil 703, or to anticipate a next position of the voice coil 703, as would be required for some linearization systems.

2. The position sensor 500 may sense the position of the voice coil 703 without directly contacting the voice coil 703. A described above, the resonator 540 attached to the former 702 may be light in weight and need not have physical contact with any other part of the speaker 700. The resonator 540 does not require cables to communicate with the antenna 530 or with any external electronic equipment.

3. The simplicity of the position sensor 500 may provide a lower-cost alternative to other position-sensing schemes that require accelerometers and other devices. The signal processing that may be used with the position sensor 500 may be relatively simple, because the position sensor 500 returns a position value, as discussed above. The position value may be directly "plugged in" to an algorithm for feedback processing, as discussed above.

4. The position sensor 500 does not require calibration for each voice coil 703 or moving object used with the position sensor 500. As described above, the position sensor 500 may be characterized and calibrated using a small number of production samples.

5. Only a small number of changes may be needed to adapt the position sensor 500 for use with conventional speaker technology. The position of the voice coil 703 on the former 702 would need to be adapted to fit the sensor coil 510; the first plate 710 would need to be adapted to accommodate the antenna 530; and the former 703 would need to be adapted to support the capacitor 520. Otherwise, remaining portions of the speaker 700 (e.g., the cone 701, the magnet 707, the pole piece 705, etc.) need not be changed.

The foregoing features may be used, separately or together in any combination, in any of the embodiments discussed herein.

Some aspects of the present technology may be embodied as one or more methods. The acts performed as part of a method may be ordered in any suitable way. Accordingly, embodiments may be constructed in which acts are performed in an order different than illustrated, which may include performing some acts simultaneously, even though shown as sequential acts in illustrative embodiments.

Further, although advantages of the present technology may be indicated, it should be appreciated that not every embodiment of the present technology may include every described advantage. Some embodiments may not implement any features described as advantageous herein. Accordingly, the foregoing description and attached drawings are by way of example only.

Variations on the disclosed embodiments are possible. For example, various aspects of the present technology may be used alone, in combination, or in a variety of arrangements not specifically discussed in the embodiments described in the foregoing, and therefore they are not limited in application to the details and arrangements of components set forth in the foregoing description or illustrated in the drawings. Aspects described in one embodiment may be combined in any manner with aspects described in other embodiments.

Use of ordinal terms such as "first," "second," "third," etc., in the description and the claims to modify an element does not by itself connote any priority, precedence, or order of one element over another, or the temporal order in which acts of a method are performed, but are used merely as labels to distinguish one element or act having a certain name from another element or act having a same name (but for use of the ordinal term) to distinguish the elements or acts.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

As used herein in the specification and in the claims, the phrase "equal" or "the same" in reference to two values (e.g., distances, widths, etc.) means that two values are the same within manufacturing tolerances. Thus, two values being equal, or the same, may mean that the two values are different from one another by ±5%.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

Also, the phraseology and terminology used herein is for the purpose of description and should not be regarded as limiting. Use of terms such as "including," "comprising," "comprised of," "having," "containing," and "involving," and variations thereof herein, is meant to encompass the items listed thereafter and equivalents thereof as well as additional items.

The terms "approximately" and "about" if used herein may be construed to mean within ±20% of a target value in some embodiments, within ±10% of a target value in some embodiments, within ±5% of a target value in some embodiments, and within ±2% of a target value in some embodiments. The terms "approximately" and "about" may equal the target value.

The term "substantially" if used herein may be construed to mean within 95% of a target value in some embodiments, within 98% of a target value in some embodiments, within 99% of a target value in some embodiments, and within 99.5% of a target value in some embodiments. In some embodiments, the term "substantially" may equal 100% of the target value.

What is claimed is:

1. A position sensor, comprising:
a resonator attachable to a first object; and
an antenna attachable to a second object and driven at a resonant frequency of the resonator, wherein a change in a distance between the first object and the second object is sensed as a change in a power of the antenna when the antenna is driven at the resonant frequency of the resonator.

2. The position sensor of claim 1, wherein, when a constant current passes through the antenna, the change in the distance between the first object and the second object is sensed by a change in a voltage of the antenna.

3. The position sensor of claim 1, wherein, when the antenna is operated at a constant voltage, the change in the distance between the first object and the second object is sensed by a change in a current that passes through the antenna.

4. The position sensor of claim 1, wherein:
the antenna comprises a flat coil disposed on a tacky surface, and
the antenna is attachable to the second object by pressing the tacky surface against a surface of the second object.

5. The position sensor of claim 1, wherein:
the resonator comprises a wire connected to a capacitor, and
the wire is attachable to the first object as a winding wound around the first object, the winding forming an inductor.

6. A voice-coil position sensor, comprising:
a pole piece;
a magnet arranged at a fixed position relative to the pole piece, the magnet having a magnetic field that extends from a first end of the magnet through the pole piece to a second end of the magnet;
a former arranged to be movable relative to the pole piece, the former structured for movement along an axial direction of the pole piece;
a voice coil attached to the former such that movement of the voice coil causes movement of the former relative to the pole piece;
a resonator attached to the former; and
an antenna driven at a resonant frequency of the resonator and located at a fixed position relative to the pole piece.

7. The position sensor of claim 6, wherein the resonator is an LC resonator comprising:
a resonator coil, and
a capacitor.

8. The position sensor of claim 7, wherein:
the former comprises a dielectric portion, and
the capacitor comprises first and second metal layers sandwiching the dielectric portion in between.

9. The position sensor of claim 8, wherein a first end of the resonator coil is electrically connected to the first metal layer, and a second end of the resonator coil is electrically connected to the second metal layer.

10. The position sensor of claim 8, wherein:
the former comprises a dielectric film, and
the first and second metal layers are first and second layers of copper foil.

11. The position sensor of claim 10, wherein the dielectric portion comprises a portion of the dielectric film.

12. The position sensor of claim 6, wherein:
the voice coil is wound around a first portion of the former, and
the resonator comprises a coil wound around a second portion of the former separate from the first portion of the former.

13. The position sensor of claim 6, wherein the pole piece and the antenna are attached to a first plate.

14. The position sensor of claim 13, wherein the second portion of the former is relatively closer to the first plate than the first portion of the former.

15. The position sensor of claim 13, wherein the antenna is a flat coil encircling the pole piece.

16. The position sensor of claim 15, further comprising:
a first power lead attached to a first end of the flat coil, and
a second power lead attached to a second end of the flat coil,
wherein the first and second power leads extend through the first plate.

17. The position sensor of claim 6, wherein the magnet is arranged to encircle the pole piece.

18. A method for controlling a position of a voice coil in an arrangement in which: the voice coil and a resonator are attached to a former that is movable relative to a pole piece along an axis of the pole piece, a magnet is arranged at a fixed position relative to the pole piece and the former, the former is movable relative to the pole piece along the axis of the pole piece in response to a power established in the voice coil, and an antenna tuned to a resonant frequency of the resonator is arranged at a fixed position relative to the pole piece, the method comprising:
establishing a first power in the voice coil;
determining an actual position of the voice coil at the first power, by measuring a power of the antenna when the first power is established in the voice coil; and
if the actual position of the voice coil at the first power is not within a predetermined distance from a desired position of the voice coil at the first power, using feedback control or feedforward control to adjust the first power in the voice coil to a compensated power for which the actual position of the voice coil is within the predetermined distance from the desired position.

19. The method of claim 18, further comprising:
determining a range of linear powers for which, for a linear power within the range, an actual position of the voice coil at the linear power, as determined by measuring a power of the antenna when the linear power is established in the voice coil, is within the predetermined distance from a desired position of the voice coil at the linear power; and,
when a voice-coil signal indicates that the linear power within the range is to be established in the voice coil, causing the linear power to be established in the voice coil.

20. The method of claim 19, further comprising:
determining, for each of a plurality of nonlinear powers outside of the range, an adjusted power for which an actual position of the voice coil at the adjusted power, as determined by measuring a power of the antenna when the adjusted power is established in the voice coil, is within the predetermined distance from a desired position of the voice coil at the nonlinear power; and,
when a voice-coil signal indicates that a nonlinear power outside of the range is to be established in the voice coil, causing an adjusted power corresponding to the nonlinear power to be established in the voice coil.

* * * * *